US 6,632,997 B2

(12) United States Patent
Hoffman et al.

(10) Patent No.: US 6,632,997 B2
(45) Date of Patent: Oct. 14, 2003

(54) PERSONALIZED CIRCUIT MODULE PACKAGE AND METHOD FOR PACKAGING CIRCUIT MODULES

(75) Inventors: Paul Robert Hoffman, Chandler, AZ (US); John Armando Miranda, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 100 days.

(21) Appl. No.: 09/880,277

(22) Filed: Jun. 13, 2001

(65) Prior Publication Data

US 2003/0000722 A1 Jan. 2, 2003

(51) Int. Cl.[7] ................................. H01L 23/28
(52) U.S. Cl. .................. 174/52.2; 174/52.4; 361/737; 257/704; 257/710
(58) Field of Search ............... 174/52.2, 52.3, 174/52.4; 361/684, 686, 728, 730, 731, 732, 737, 740, 747; 257/679, 704, 710

(56) References Cited

U.S. PATENT DOCUMENTS

| 4,532,419 | A | * | 7/1985 | Takeda .................. 235/492 |
| 4,905,124 | A | | 2/1990 | Banjo et al. |
| 4,974,120 | A | | 11/1990 | Kodai et al. |
| 5,461,256 | A | * | 10/1995 | Yamada et al. ............ 257/679 |
| 5,574,309 | A | | 11/1996 | Papapietro et al. |
| 5,742,479 | A | | 4/1998 | Asakura |
| 5,774,339 | A | * | 6/1998 | Ohbuchi et al. ........... 361/737 |
| 5,784,259 | A | | 7/1998 | Asakura |
| 5,822,190 | A | | 10/1998 | Iwasaki |
| 5,907,125 | A | * | 5/1999 | Buekers et al. ............ 174/52.1 |
| 6,020,219 | A | * | 2/2000 | Dudderar et al. .......... 438/118 |
| 6,040,622 | A | | 3/2000 | Wallace |
| D445,096 | S | | 7/2001 | Wallace |
| D446,525 | S | | 8/2001 | Okamoto et al. |

FOREIGN PATENT DOCUMENTS

| JP | 3-112688 | 5/1991 |
| JP | 07017175 A | 1/1995 |
| JP | 08190615 A | 7/1996 |
| JP | 10-12646 | 1/1998 |
| JP | 10-334205 | 12/1998 |
| JP | 11-45959 | 2/1999 |

* cited by examiner

Primary Examiner—Dean A. Reichard
Assistant Examiner—Carmelo Oliva
(74) Attorney, Agent, or Firm—Weiss, Moy & Harris, P.C.

(57) ABSTRACT

A personalized circuit module package and method for packaging circuit modules provides graphical packaging for memory modules and other circuit modules. A removable housing is attached to a circuit module containing one or more integrated circuits bonded to a carrier and covered with an encapsulant. Graphics may be printed on the removable housing, or may be printed on an insert that is either inserted into a pocket within the removable housing, or is inserted between a removable housing having a window and the circuit module. Alternatively, the housing itself may be used to personalize the circuit module, by providing a colored or textured removable housing for the circuit module.

20 Claims, 5 Drawing Sheets

PERSONALIZED CIRCUIT MODULE PACKAGE AND METHOD FOR PACKAGING CIRCUIT MODULES

FIELD OF THE INVENTION

The present invention relates generally to circuit module packaging, and more specifically, to a method and assembly for personalized packaging of circuit modules.

BACKGROUND OF THE INVENTION

Removable circuit modules or cards are increasing in use to provide storage and other electronic functions for devices such as digital cameras, personal computing devices and personal digital assistants (PDAs). The circuit modules are typically mass produced by a module manufacturer and are labeled in a manner that identifies the device and the manufacturer. New uses for memory cards include Multi-Media cards as promoted by the MultiMediaCard Association (MMCA).

Consumers and third-party distributors or manufacturers generally desire to identify products in a manner that promotes their identity or identification of the product. In the case of memory modules, the identification might be the identification of the contents of the module, such as software program packaging that readily identifies the product. Therefore, it would be desirable to provide a method and assembly for packaging circuit modules that is personalizable to a third-party manufacturer's packaging design or personalizable by an end-user.

SUMMARY OF THE INVENTION

A personalized circuit module package and method for packaging circuit modules provides graphical packaging for memory modules and other circuit modules. A removable housing comprises a top portion for displaying a personalized graphic and a frame portion for removably attaching the housing to a circuit module containing one or more integrated circuits bonded to a carrier and optionally covered with an encapsulant. Alternatively, the housing may be a colored or textured housing without a personalized graphic, whereby the circuit modules are personalized via the color or texture of the housing itself.

BRIEF DESCRIPTION OF THE DRAWINGS

The invention, as well as a preferred mode of use and advantages thereof, will best be understood by reference to the following detailed description of illustrative embodiments when read in conjunction with the accompanying drawings, wherein like reference numerals indicate like parts throughout.

DETAILED DESCRIPTION

Figure 1:
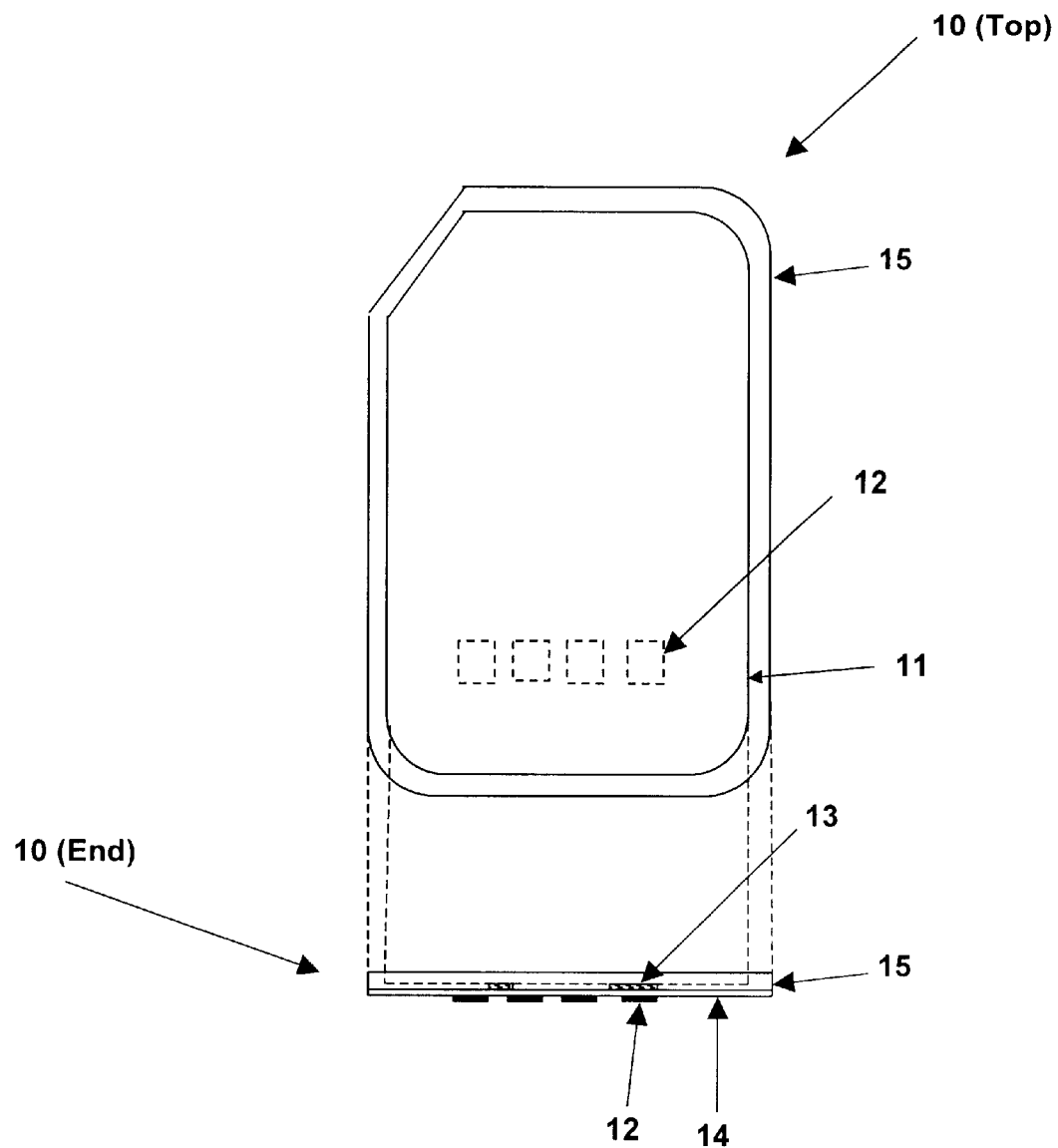
FIG. 1 is a pictorial diagram depicting top and end views of a prior art circuit module.

Referring now to the figures and in particular to FIG. 1, a top view and an end view of a prior art circuit module 10 are depicted. Circuit module 10 is depicted as a circuit module as used in various multimedia memory applications and compatible with the MultiMediaCard Association (MMCA) standards for multimedia memory cards (MMC). The present invention is also applicable to cards and modules having other outlines such as Secure Digital cards as promulgated by the Secure Digital Association (SDA) and various compact flash memory cards, etc. The present invention applies to peripheral device cards (I/O cards), as well.

A carrier 14 to which integrated circuit dies 13 are attached and circuit contacts 12 are included on the bottom side, is covered by a lid 15 that is bonded to carrier 14. The housing may be completely formed from an encapsulant, or the circuit may be encapsulated and a lid 15 applied over the encapsulant. A cavity 11 is included in the lid 15 and a graphic identifying circuit module 10 is typically applied in this cavity 11. The graphics used are typically the manufacturer's identification and are neither removable or personalizable by an end-user or a third-party manufacturer.

Figure 2:
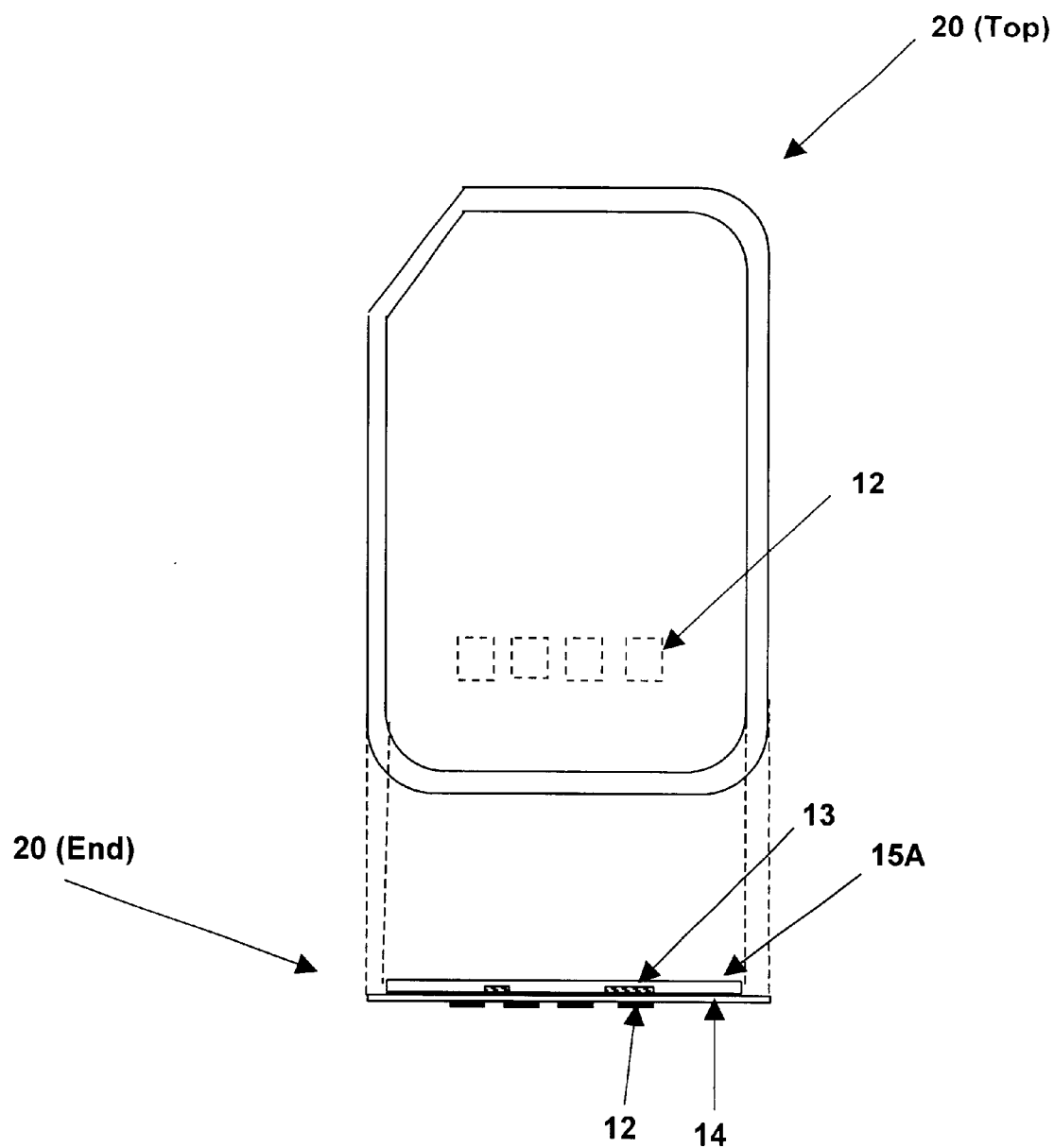
FIG. 2 is a pictorial diagram depicting top and end views of a circuit module in accordance with an embodiment of the invention.

Referring now to FIG. 2, a top and an end view of a circuit module in accordance with an embodiment of the invention is depicted. Circuit module 20 is adapted for use with a removable housing that includes a personalizable graphic. Rather than using a lid 15 having a cavity 11 as the prior art circuit module 10 in FIG. 1, circuit module 20 has a lid 15A that does not extend completely to the sides of carrier 14. Lid 15A covers dies 13 and is permanently attached to carrier 14. The edge of lid 15A may be adapted to accept a removable housing that will be further illustrated below. The adaptation of circuit module 20 provides for personalization of graphics by attachment and removal of a removable housing for holding a graphical insert on which graphics may be printed, proving a fast and economical method for personalization. Alternatively, removable housing may be colored or textured to provide personalization without attachment of a pictorial or textual graphic.

Since MMCs, SD cards and other applications for circuit modules require very thin packages, the removable housing must be made with very thin walls from a material which is generally an injection molded plastic resin. In order to mold a thin wall housing of this sort, it is generally necessary to vent the mold by using PORCERAX or another porous mold material, rather than using standard venting techniques. The porous molding material relieves pressure within the mold, permitting thin plastic structures to be made in a fast molding process, without the use of vents that would disrupt the surface of the removable housing and permitting the molten resin to flow fast enough to fill all of the mold features. The mold may be made with PORCEPAX sides, which will permit air to escape through the mold walls. A housing made by the above-described mold may be identified by rough surfaces in areas that have contacted the PORCERAX portions of the mold.

Figure 3:
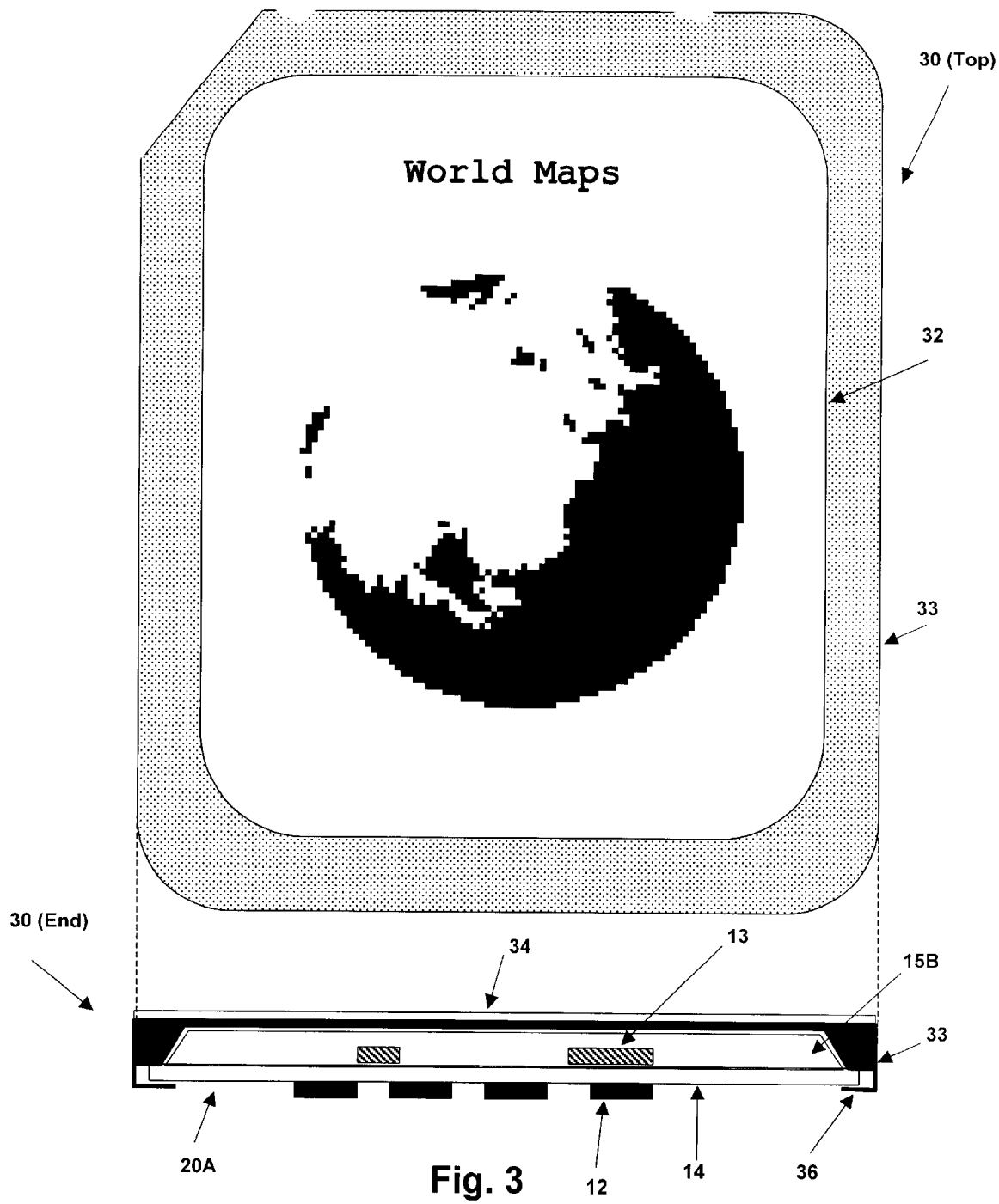
FIG. 3 is a pictorial diagram depicting top and end views of a circuit module attached to a removable housing in accordance with an embodiment of the invention.

Referring now to FIG. 3, a top and an end view of a circuit module/removable housing assembly is depicted in accordance with an embodiment of the invention. A removable housing is attached to a circuit module 20A and retained by flexible tabs 36 that are formed at the edge of the bottom of removable housing 33.

Removable housing 33 provides a graphic mount 34 for a graphic 32 that may be screen printed, pad printed, direct laser printed or an insert may be printed and molded into removable housing 33. Alternatively, graphic mount 34 may be a pocket for insertion of an insert containing graphic 32. In the alternative embodiment having a pocket, the graphic mount 34 may be a frame with a window for displaying a graphic 32 that is insertable between removable housing 33 and circuit module 20A. The window may be covered or may be an aperture that exposes the surface of graphic within a frame formed by removable housing 33.

Circuit module 20A is depicted as an encapsulation forming a lid 15B. While a separate lid may be applied, a lid for dies 13 may be provided by an encapsulant molded in the form depicted as lid 15B. Lid 15B does not extend to the edges of carrier 14, but provides an exposed portion of carrier, which may be a printed circuit board or other substrate suitable for mounting of dies as known to those of ordinary skill in the art of integrated circuit packaging. The edges of carrier 14 are used as a retaining edge, retaining circuit module 20A within removable housing 33 in conjunction with flexible tabs 36, but lid 15B can be extended to the edges of carrier 14 for use in conjunction with other retaining designs.

Figure 4A:
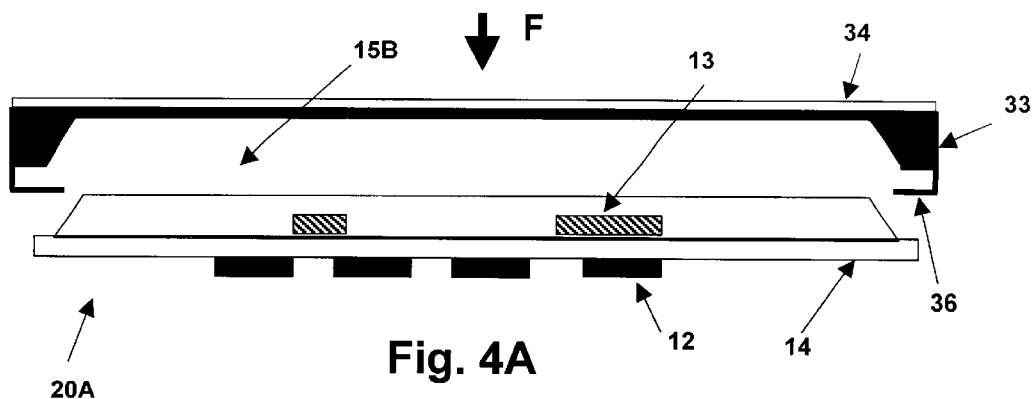
FIG. 4A is a pictorial diagram depicting end views of the removable housing and the circuit module of FIG. 3.

Referring now to FIG. 4A, an end view of circuit module 20A and removable housing 33 are depicted in their unattached configuration, with an arrow depicting the attachment direction in which a force may be applied to attach the removable housing 33 to circuit module 20A. In this depiction, flexible tabs 36 are clearly illustrated with circuit module 20A removed. When removable housing 33 is brought in contact with circuit module 20A and a slight force (F) is applied in the indicated direction, flexible tabs 36 will deform temporarily, permitting circuit module 20A to enter the bottom of removable housing 33 and be retained by flexible tabs 33 in accordance with the configuration of FIG. 2.

Figure 4B:
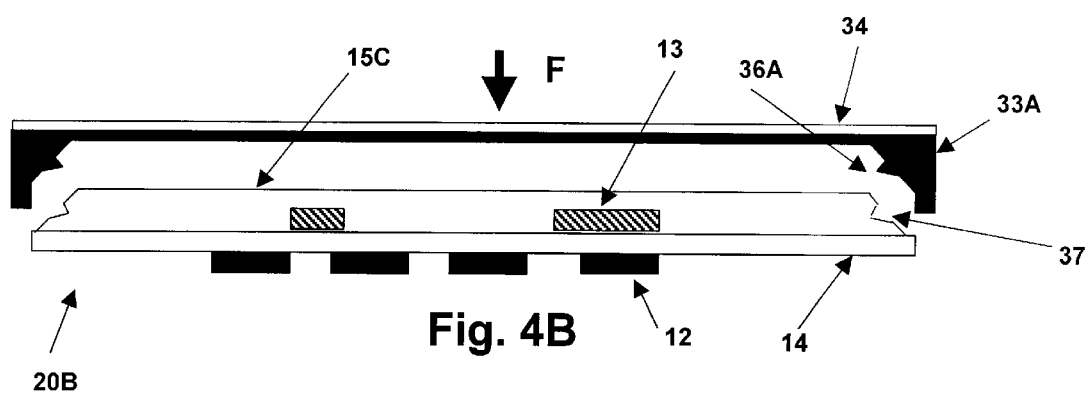
FIGS. 4B, 4C and 4D are pictorial diagrams depicting end views of a removable housing and circuit module in accordance with alternative embodiments of the invention.

Referring now to FIG. 4B, an end view of an alternative embodiment of a removable housing 33A and a circuit module 20B in accordance with the present invention is depicted. In this embodiment, a retaining edge is formed on both removable housing 33A and circuit module 20B by means of a protrusion 36A molded into removable housing 33A and a mating recess 37 molded in the enapsulant forming lid 15C. When removable housing 33A is brought in contact with circuit module 20B and a slight force (F) is applied in the indicated direction, the edges of removable housing 33A will deform temporarily, permitting circuit module 20B to enter the bottom of removable housing 33A, seating protrusion 36A within mating recess 37, thereby retaining circuit module 20B within removable housing 33A.

Figure 4C:
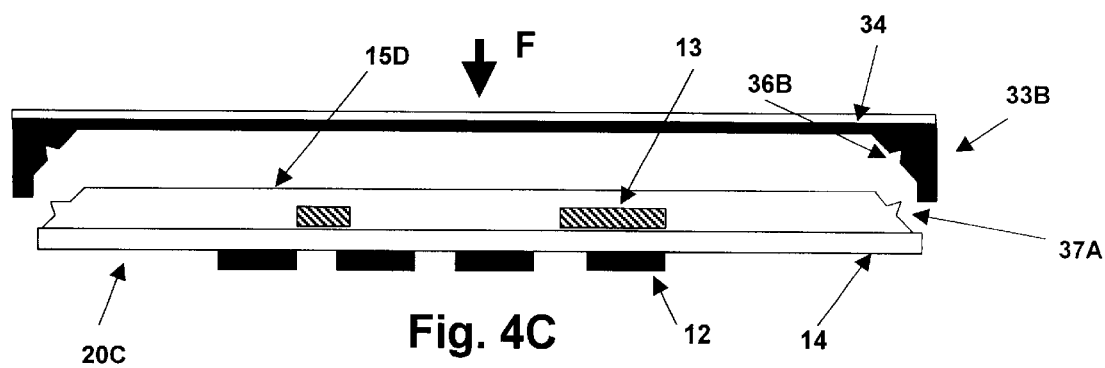

Referring now to FIG. 4C, an end view of another alternative embodiment of a removable housing 33B and a circuit module 20C in accordance with the present invention is depicted. In this other alternative embodiment, a retaining edge is formed on both removable housing 33B and circuit module 20C by means of a protrusion 37A molded into the enapsulant forming lid 15D and a mating recess 36B molded in removable housing 33B. When removable housing 33B is brought in contact with circuit module 20C and a slight force (F) is applied in the indicated direction, the edges of removable housing 33B will deform temporarily, permitting circuit module 20C to enter the bottom of removable housing 33B, seating protrusion 37A within mating recess 36B, thereby retaining circuit module 20C within removable housing 33B.

Figure 4D:
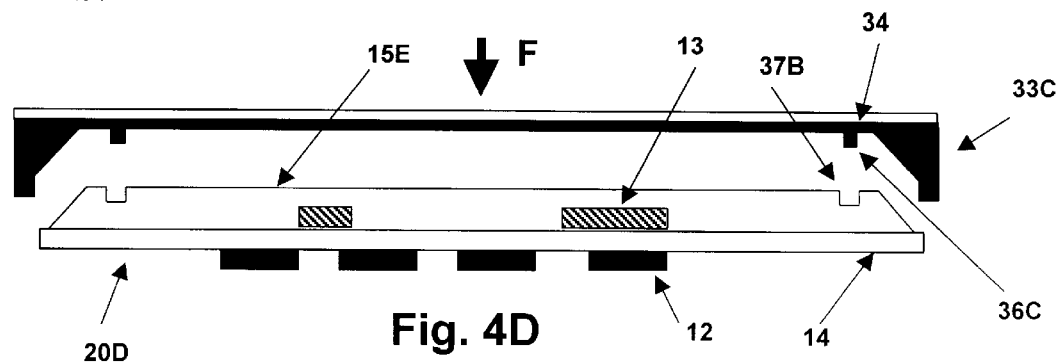

Referring now to FIG. 4D, an end view of yet another alternative embodiment of a removable housing 33C and a circuit module 20D in accordance with the present invention is depicted. In this other alternative embodiment, a retaining mechanism is formed on both removable housing 33C and circuit module 20D by means of a protrusion 36C molded in removable housing 33C and a mating recess 37B molded into the enapsulant forming lid 15E. When removable housing 33C is brought in contact with circuit module 20D and a slight force (F) is applied in the indicated direction, protrusion 36C will seat within mating recess 37B, thereby retaining circuit module 20D within removable housing 33C. Thus, recesses or protrusions may be used on either the inside surfaces of a removable housing with a corresponding mating surface molded in the encapsulant. When the removable housing is then attached by applying force, then the mating surfaces will interlock and retain the removable housing to the encapsulent, detachably coupling the removable housing to the circuit module.

Figure 5:
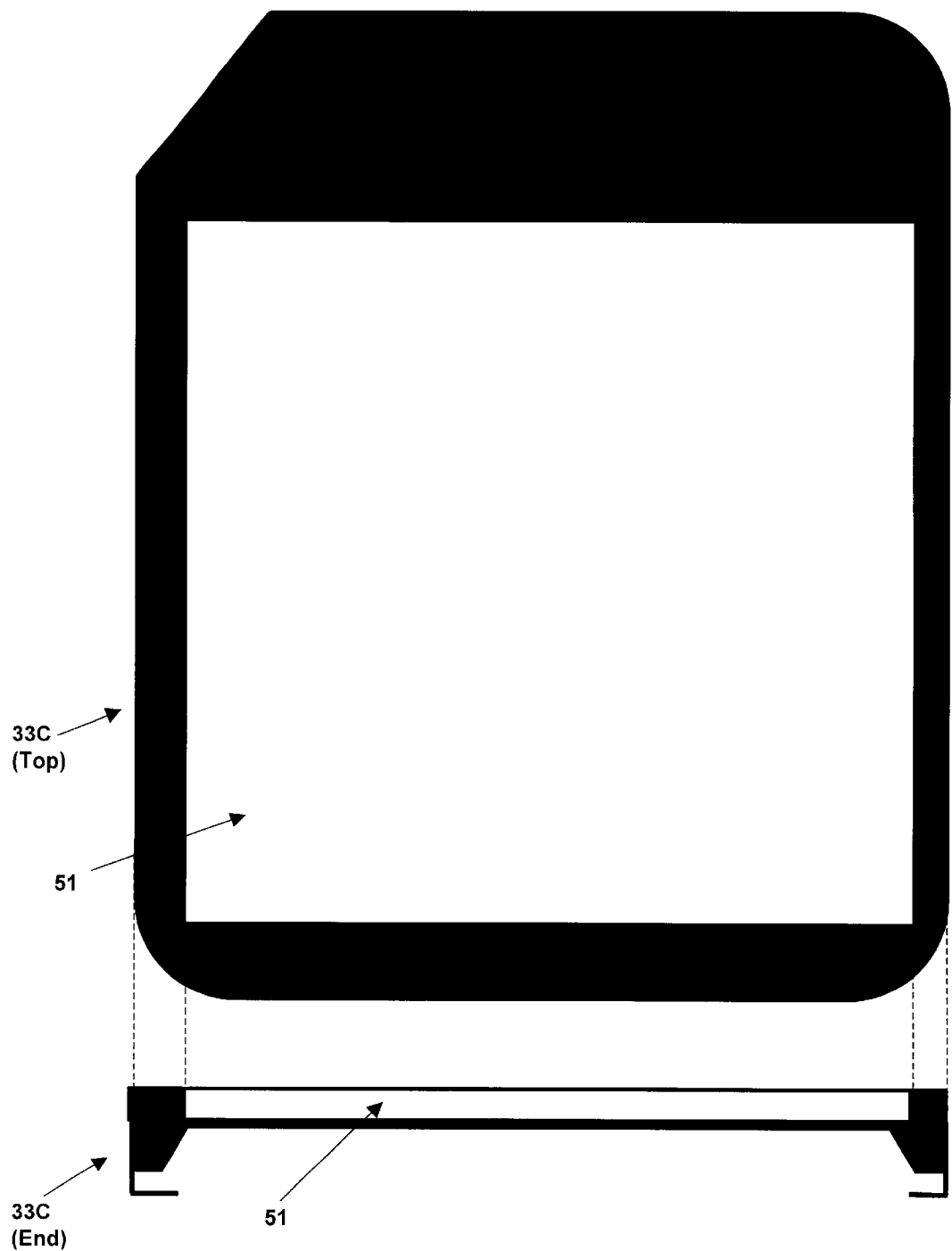
FIG. 5 is a pictorial diagram depicting top and end views of a removable housing having a pocket for receiving a graphical insert in accordance with an embodiment of the invention.

Referring now to FIG. 5, a removable housing 33C in accordance with an embodiment of the invention having a pocket 51 for receiving a graphical insert is depicted. A graphical insert may be slid into the end of removable housing 33C via pocket 51 and retained by friction. The top of pocket 51 is made from a transparent material such as mylar, permitting a graphical insert inserted within pocket 51 to be viewed from the top side of removable housing 33C.

In all of the above-illustrated embodiments of the present invention, removable lid 33, 33A or 33B has a graphical mount 34 for either retaining a graphical insert, or on which graphics may be printed or embossed. A variety of graphically decorated removable housings may be marketed or provided by the module manufacturer so that custom colors or designs may be affixed to the circuit module to personalize the module in accordance with the preferences of an end-user or third-party manufacturer. The color or texture of the removable housing may be the personalization available, rather than a pictorial or textual graphic design. The graphical content may be delivered to the manufacturer of the removable housings via the Internet and printed on the removable housings prior to assembly, or an end-user may print an insert on a personal computer printer and affix the insert using a removable housing having either a pocket for an insert or by inserting an insert behind a removable housing having an open window for viewing the inserted graphic.

The above description of embodiments of the invention is intended to be illustrative and not limiting. Other embodiments of this invention will be obvious to those skilled in the art in view of the above disclosure and fall within the scope of the present invention.

What is claimed is:

1. A circuit module, comprising:
    at least one integrated circuit for providing an electronic function of the circuit module;
    a carrier for mounting the at least one integrated circuit within the circuit module;
    an encapsulation containing the at least one integrated circuit on top of the carrier; and
    a detachable housing not chemically bonded to the encapsulation or carrier for covering the encapsulation.

2. The circuit module of claim 1, wherein the removable housing has personalized graphics on at least one surface thereof.

3. The circuit module of claim 1, wherein the removable housing comprises a lid having an interlocking edge for attaching the removable housing to the carrier.

4. The circuit module of claim 3, wherein the interlocking edge comprises multiple tabs for retaining the carrier within the housing.

5. The circuit module of claim 3, wherein the interlocking edge comprises a protrusion on an inside surface of the removable housing, and wherein the encapsulation is formed with a mating recess having a shape adapted to mate with the protrusion for retaining the carrier within the housing.

6. The circuit module of claim 3, wherein the interlocking edge comprises a recess on an inside surface of the removable housing, and wherein the encapsulation is formed with a mating protrusion having a shape adapted to mate with the recess for retaining the carrier within the housing.

7. The circuit module of claim 1, wherein one side of the carrier includes a set of terminals that are visible from the side of the circuit module, wherein the set of terminals is positioned away from the edge of the carrier.

8. The circuit module of claim 1, wherein the removable housing comprises a pocket for receiving an insert whereon graphics are printed.

9. The circuit module of claim 1, wherein the removable housing defines a window opening to the encapsulation, whereby an insert whereon graphics are printed may be viewed when inserted between the encapsulation and the removable housing.

10. A circuit module, comprising:
- at least one integrated circuit for providing an electronic function of the circuit module;
- a carrier for mounting the at least one integrated circuit within the circuit module;
- an encapsulation containing the at least one integrated circuit on top of the carrier; and
- means for detachably covering the encapsulation, whereby the covering means is not chemically bonded to the encapsulation or carrier.

11. The circuit module of claim 10, wherein the removable covering means has personalized graphics on at least one surface thereof.

12. A removable housing adapted for attachment to a circuit module, wherein the removable housing comprises:

- a top portion; and
- a substantially rectangular frame portion disposed around the edges of the top portion for detachably coupling the top portion to the circuit module, whereby the housing can be attached to a circuit module without chemical bonding.

13. The removable housing of claim 12, wherein the top portion includes personalized graphics on a surface thereof.

14. The removable housing of claim 13, wherein the top portion comprises a pocket for receiving an insert whereon the personalized graphics are printed.

15. The removable housing of claim 13, wherein the top portion defines a window opening to the circuit module, whereby an insert whereon the personalized graphics are printed may be viewed when inserted between the circuit module and the removable housing.

16. The removable housing of claim 12, wherein the frame portion has an interlocking edge for attaching the removable housing to the circuit module.

17. The removable housing of claim 16, wherein the interlocking edge comprises multiple tabs for retaining the circuit module within the housing.

18. The removable housing of claim 16, wherein the interlocking edge comprises a protrusion on an inside surface of the removable housing, and wherein the circuit module is formed with a mating recess having a shape adapted to mate with the protrusion for retaining the circuit module within the removable housing.

19. The removable housing of claim 16, wherein the interlocking edge comprises a recess on an inside surface of the removable housing, and wherein the circuit module is formed with a mating protrusion having a shape adapted to mate with the recess for retaining the circuit module within the removable housing.

20. The removable housing of claim 12, wherein one side of the circuit module includes a set of terminals that are visible from the side of the circuit module, wherein the set of terminals is positioned away from the edge of the circuit module when the removable housing is attached.

* * * * *